(12) United States Patent
Yang et al.

(10) Patent No.: US 10,456,956 B1
(45) Date of Patent: Oct. 29, 2019

(54) MULTI-CHEMISTRY MICROLATTICE STRUCTURES AND METHODS OF MANUFACTURING THE SAME

(71) Applicant: HRL LABORATORIES, LLC, Malibu, CA (US)

(72) Inventors: Sophia S. Yang, Los Angeles, CA (US); Alan J. Jacobsen, Woodland Hills, CA (US); Zak C. Eckel, Calabasas, CA (US); Jacob M. Hundley, Newbury Park, CA (US); William Carter, Calabasas, CA (US)

(73) Assignee: HRL Laboratories, LLC, Malibu, CA (US)

( * ) Notice: Subject to any disclaimer, the term of this patent is extended or adjusted under 35 U.S.C. 154(b) by 21 days.

(21) Appl. No.: 15/650,335

(22) Filed: Jul. 14, 2017

Related U.S. Application Data

(63) Continuation of application No. 14/462,521, filed on Aug. 18, 2014, now Pat. No. 9,738,013.

(60) Provisional application No. 61/918,546, filed on Dec. 19, 2013.

(51) Int. Cl.
| | | |
|---|---|---|
| *B32B 3/12* | (2006.01) | |
| *G03F 7/26* | (2006.01) | |
| *B29C 35/08* | (2006.01) | |
| *G03F 7/20* | (2006.01) | |

(52) U.S. Cl.
CPC ............ *B29C 35/0805* (2013.01); *B32B 3/12* (2013.01); *G03F 7/20* (2013.01); *G03F 7/26* (2013.01); *B29C 2035/0827* (2013.01)

(58) Field of Classification Search
None
See application file for complete search history.

(56) References Cited

U.S. PATENT DOCUMENTS

| | | |
|---|---|---|
| 4,575,330 A | 3/1986 | Hull |
| 6,309,423 B2 | 10/2001 | Hayes |
| 6,631,231 B2 | 10/2003 | Mizuuchi et al. |
| 6,650,817 B2 | 11/2003 | Murali |
| 6,660,192 B1 | 12/2003 | Kim et al. |
| 6,684,007 B2 | 1/2004 | Yoshimura et al. |
| 6,862,393 B2 | 3/2005 | Nashimoto |
| 6,879,757 B1 | 4/2005 | Zhou et al. |
| 6,898,362 B2 | 5/2005 | Forbes et al. |
| 6,952,504 B2 | 10/2005 | Bi et al. |
| 6,993,235 B2 | 1/2006 | Takagi et al. |
| 7,006,747 B2 | 2/2006 | Escuti et al. |

(Continued)

OTHER PUBLICATIONS

Bertsch et al., "Microstereolithography: a Review," Mat. Res. Soc. Symp. Proc., vol. 758, pp. LL1.1.1-LL1.1.13, 2003.

(Continued)

*Primary Examiner* — David Sample
*Assistant Examiner* — Nicole T Gugliotta
(74) *Attorney, Agent, or Firm* — Lewis Roca Rothgerber Christie, LLP

(57) ABSTRACT

A multi-chemistry structure includes: a plurality of interconnected polymer struts arranged in a lattice; a first layer of the lattice including a first array of first unit cells; a second layer of the lattice including a second array of second unit cells; at least one region of the lattice being formed of a first polymer; and at least one region of the lattice being formed of a second polymer different from the first polymer.

7 Claims, 14 Drawing Sheets

(56) References Cited

U.S. PATENT DOCUMENTS

| | | |
|---|---|---|
| 7,020,374 B2 | 3/2006 | Talin et al. |
| 7,024,093 B2 | 4/2006 | Shelnut et al. |
| 7,088,432 B2 | 8/2006 | Zhang |
| 7,575,807 B1 | 8/2009 | Barvosa-Carter et al. |
| 7,582,349 B1 | 9/2009 | Herrera et al. |
| 8,195,023 B1 | 6/2012 | Jacobsen et al. |
| 8,320,727 B1 | 11/2012 | Jacobsen et al. |
| 9,116,428 B1 | 8/2015 | Jacobsen et al. |
| 9,738,013 B1 * | 8/2017 | Yang .................. B29C 35/0805 |
| 2004/0021237 A1 | 2/2004 | Shimizu et al. |
| 2004/0264863 A1 | 12/2004 | Suzuki et al. |
| 2005/0069637 A1 | 3/2005 | Bae et al. |
| 2005/0135745 A1 | 6/2005 | Greiner et al. |
| 2005/0287696 A1 | 12/2005 | Dumais et al. |
| 2006/0029348 A1 | 2/2006 | Kempen et al. |
| 2010/0298952 A1 | 11/2010 | Busold et al. |
| 2011/0229823 A1 | 9/2011 | Rock et al. |

OTHER PUBLICATIONS

Chuang et al., "A New Method to Fabricate Polymer Waveguides," Progress in Electromagnetics Research Symposium, pp. 92-95, Aug. 22-26, 2005.

Kagami et al., "Light-induced self-written three-dimensional optical waveguide," Applied Physics Letters, 79(8):1079-1081, Aug. 20, 2001.

Kewitsch et al., "Nonlinear optical properties of photoresists for projection lithography," Appl. Phys. Lett., 68(4):455-457, Jan. 22, 1996.

Pan et al., "Rapid Manufacturing in Minutes: The Development of a Mask Projection Stereolithography Process for High-Speed Fabrication," ASME, pp. 1-10, Jun. 4-8, 2012.

Shoji et al., "Optically-induced growth of fiber patterns into a photopolymerizable resin," Applied Physics Letters, 75(5):737-739, Aug. 2, 1999.

Sun et al., "Two-Photon Photopolymerization and 3D Lithographic Microfabrication," APS, 170:169-273, 2004.

* cited by examiner

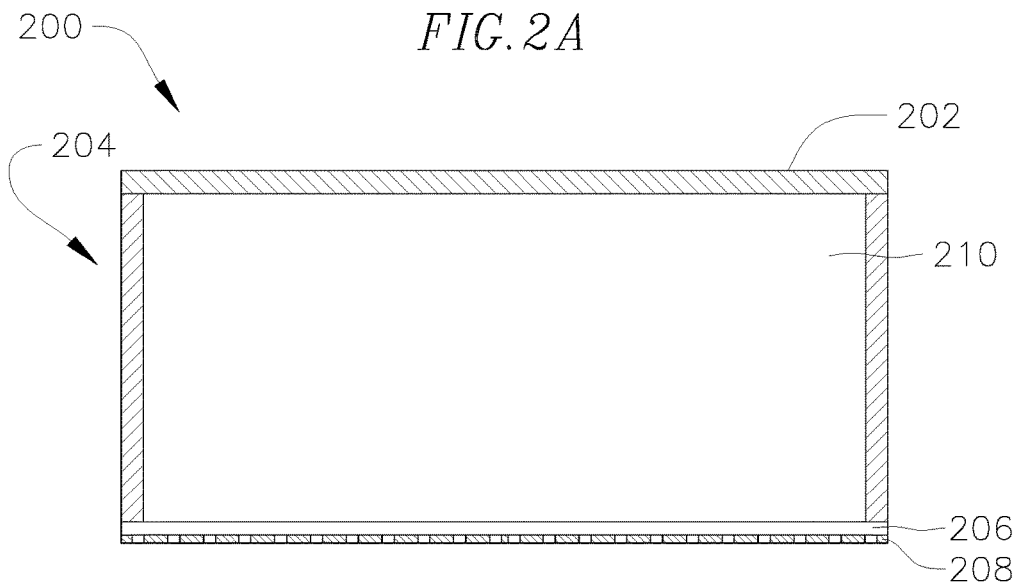
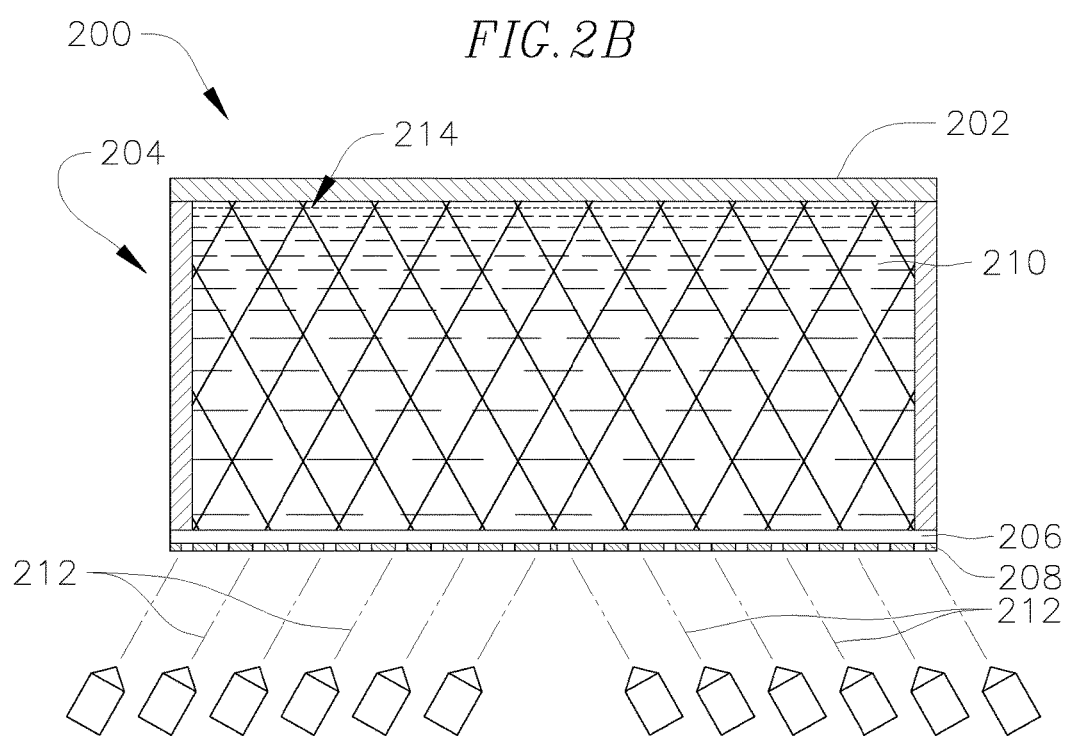

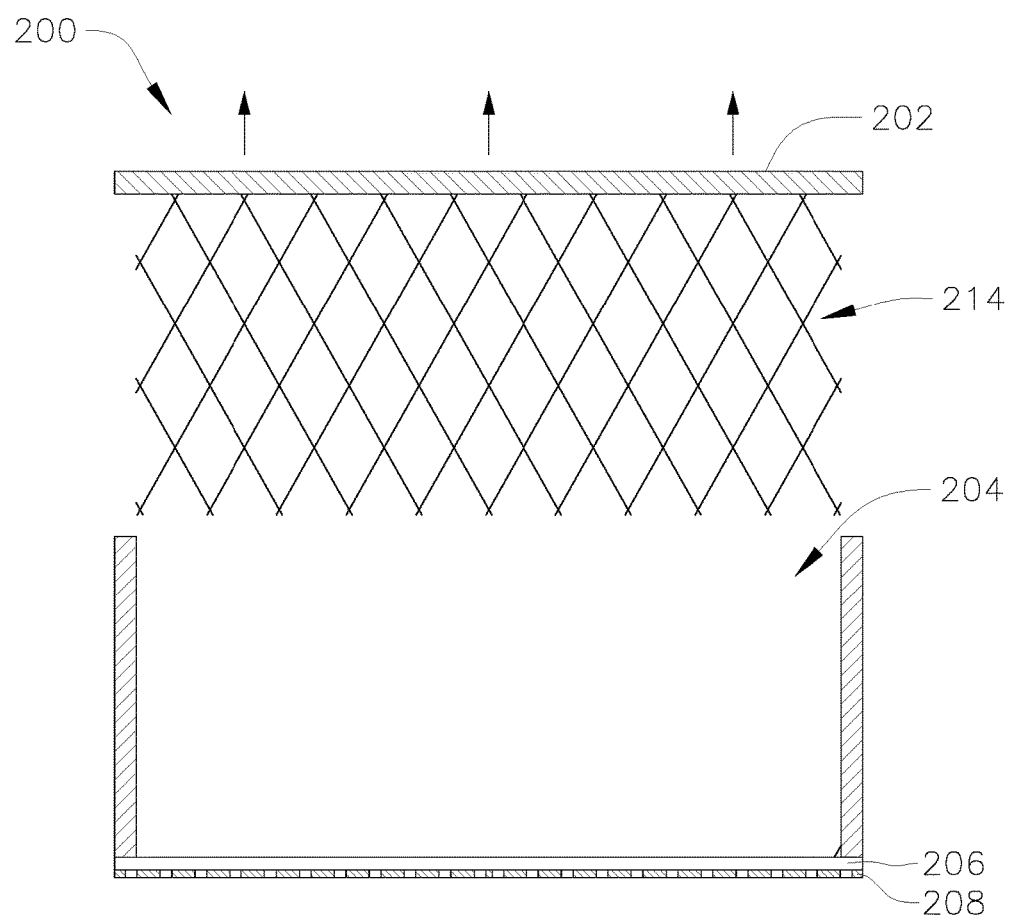

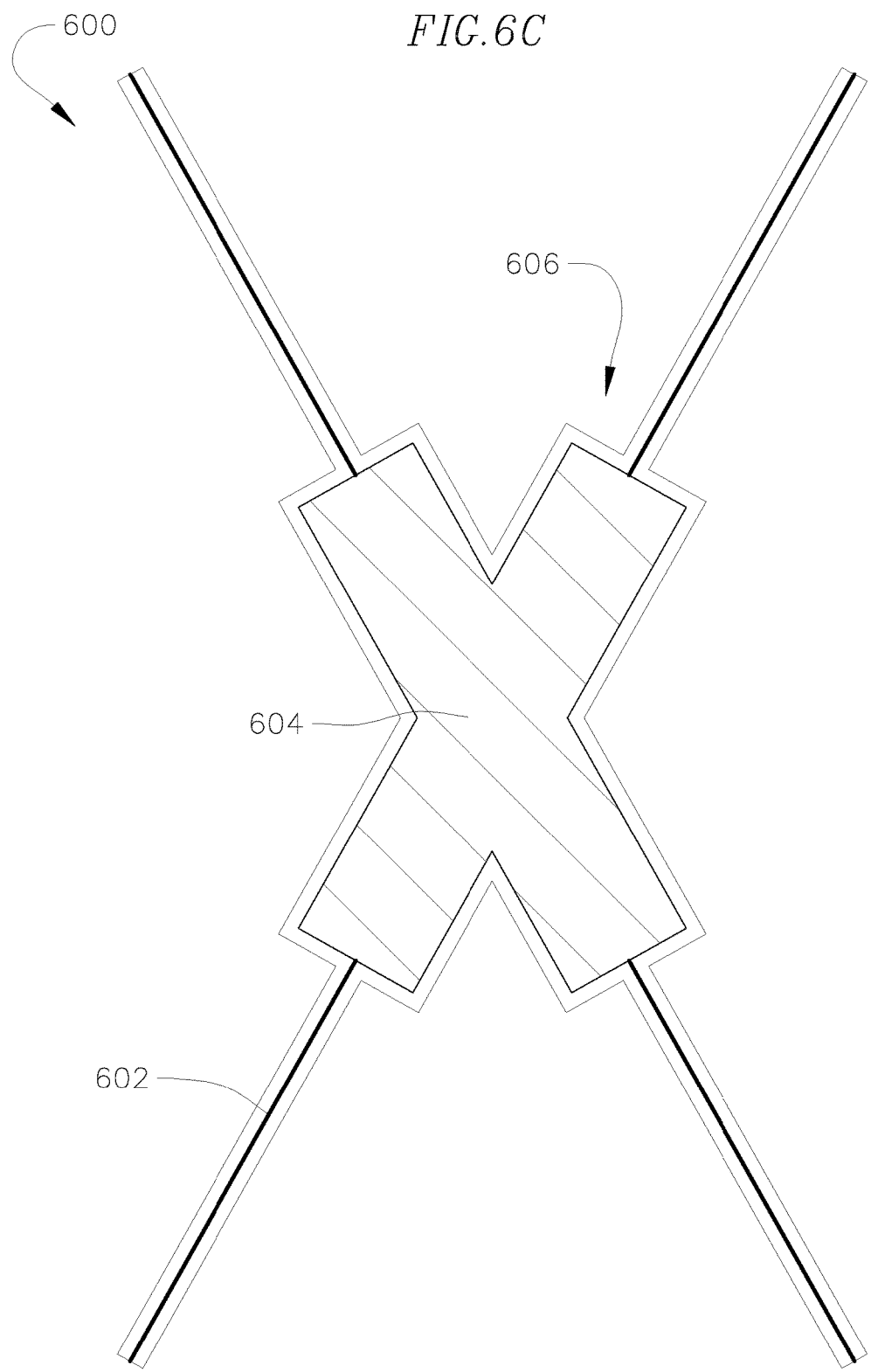

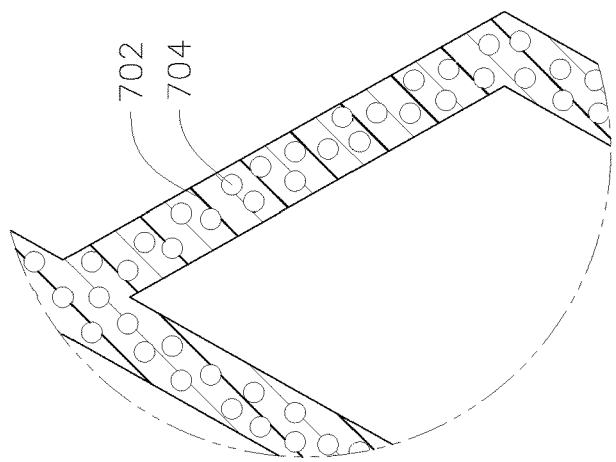
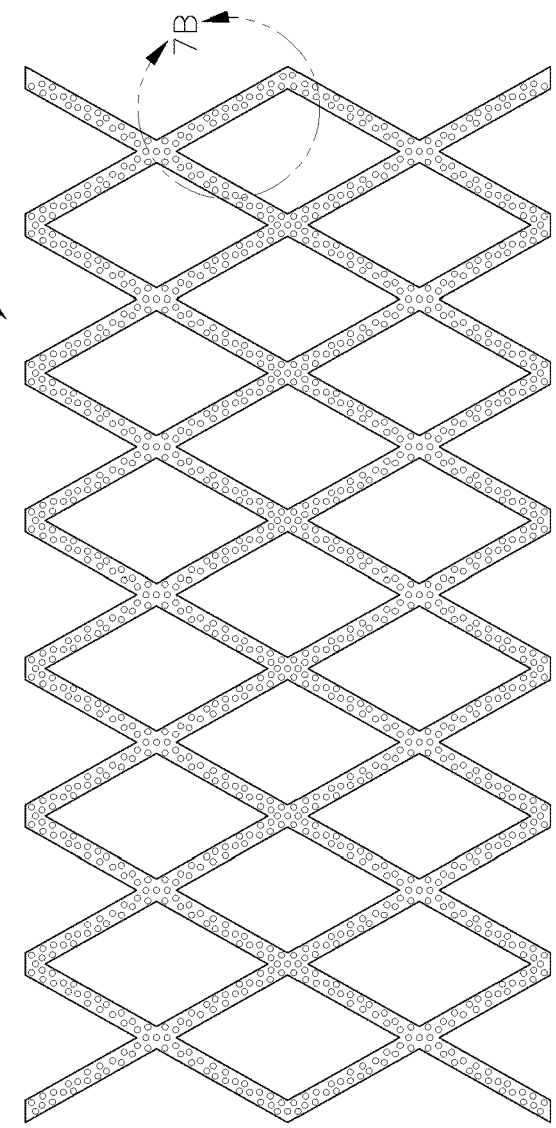

MULTI-CHEMISTRY MICROLATTICE STRUCTURES AND METHODS OF MANUFACTURING THE SAME

CROSS-REFERENCE TO RELATED APPLICATION(S)

This application claims is a continuation of U.S. application Ser. No. 14/462,521, filed Aug. 18, 2014, which claims the benefit of and priority to U.S. Provisional Application No. 61/918,546, filed Dec. 19, 2013, the entire contents of which are incorporated herein by reference.

FIELD

The present invention relates generally to microlattice structures, and, more particularly, to multi-chemistry microlattice structures.

BACKGROUND

Microlattice structures are ubiquitous. They are utilized in various mechanical applications, such as in heat exchangers (e.g., transmission oil coolers, evaporators, radiators, etc.), in energy absorbing materials (e.g., bumper beams, blast protections, etc.), and in cushions and paddings (e.g., mattresses and beddings).

Typical methods of manufacturing microlattice structures are used in manufacturing single-chemistry microlattice structures, which are limited in customization and functionality. Furthermore, typical methods utilized to manufacture single-chemistry microlattice structures would be inefficient when used to fabricate multi-chemistry structures.

SUMMARY

The present disclosure is directed toward various embodiments of a multi-chemistry structure. In one embodiment, the multi-chemistry structure includes: a plurality of interconnected polymer struts arranged in a lattice; a first layer of the lattice including a first array of first unit cells; a second layer of the lattice including a second array of second unit cells; at least one region of the lattice being formed of a first polymer; and at least one region of the lattice being formed of a second polymer different from the first polymer.

The first layer may be formed of the first polymer; the second layer may be formed of the second polymer; and the first polymer may be bonded to the second polymer at an interface between the first and second polymers.

The first unit cells of the first layer may have different unit sizes than those of the second unit cells of the second layer.

The first unit cells of the first layer may be smaller than the second unit cells of the second layer.

The first unit cells may be bonded to respective second unit cells at a plurality of respective nodes; regions surrounding the respective nodes may be formed of the second polymer; and non-nodal remainder regions of the first and second unit cells may be formed of the first polymer.

The second unit cells may be between respective first unit cells at gaps between the first unit cells such that portions of the second unit cells overlap portions of the first unit cells; the first unit cells may be formed of the first polymer; and the second unit cells may be formed of the second polymer.

The second unit cells may be formed on the first unit cells such that the second unit cells encapsulate trusses of the first unit cells; the first unit cells may be formed of the first polymer; and the second unit cells may be formed of the second polymer.

The first unit cells may be formed of the first and second polymers alternately along the first layer; and the second unit cells may be formed of the first and second polymers alternately along the second layer.

Corresponding second unit cells may be formed of different polymers than respective first unit cells that are bonded to the corresponding second unit cells.

The second polymer may be more susceptible to etching than the first polymer.

Nodes of the lattice may be formed of the first polymer and struts of the lattice may be formed of the second polymer.

A diameter of the struts may be less than a diameter of the nodes.

The first and second polymers may be immiscible; and the second polymer may be mixed in the first polymer.

The lattice may be formed of the first polymer; and microspheres formed of the second polymer may be embedded in the lattice.

The present disclosure is also directed toward various methods for manufacturing a multi-chemistry structure. In one embodiment, the method includes a method of manufacturing a multi-chemistry structure, the method including: irradiating a first photo-monomer with a plurality of collimated light beams to form a first polymer structure; and irradiating a second photo-monomer different than the first photo-monomer with a plurality of collimated light beams to form a second polymer structure bonded to the first polymer structure.

The irradiating of the first photo-monomer occurs through a first photomask; and the irradiating of the second photo-monomer occurs through a second photomask different from the first photomask.

The method may further include etching the first and second polymer structure.

The second polymer structure may be more susceptible to etching than the first polymer structure.

The method may further include coating the first and second polymer structures in a uniform coating.

The method may further include removing the first and second polymer structures such that a hollow structure outlined by the uniform coating remains.

The method may further include: lifting the first polymer structure out of a reservoir containing an unpolymerized volume of the first photo-monomer; removing the unpolymerized volume of the first photo-monomer from the reservoir; filling the reservoir with the second photo-monomer; and lowering the first polymer structure into the reservoir to contact the second photo-monomer before the irradiating of the second photo-monomer with the collimated light beams.

In another embodiment, a method of manufacturing a multi-chemistry structure includes: filling a reservoir with a first photo-monomer adapted to polymerize when exposed to light having a first wavelength; mixing a second photo-monomer adapted to polymerize when exposed to light having a second wavelength with the first photo-monomer, the first and second photo-monomers being immiscible and different from each other; irradiating the first photo-monomer with a plurality of collimated light beams having the first wavelength to form a first polymer structure, the first polymer structure including the mixed second photo-monomer; and irradiating the second photo-monomer with light having the second wavelength such that the first polymer structure includes a mixed second polymer structure.

The first polymer structure may be a microlattice structure.

The second polymer structure may be a plurality of microspheres embedded within the first polymer structure.

The second polymer structure may be an interpenetrating network within the first polymer structure.

This summary is provided to introduce a selection of concepts that are further described below in the detailed description. This summary is not intended to identify key or essential features of the claimed subject matter, nor is it intended to be used in limiting the scope of the claimed subject matter.

BRIEF DESCRIPTION OF THE DRAWINGS

These and other features and advantages of embodiments of the present disclosure will become more apparent by reference to the following detailed description when considered in conjunction with the following drawings. In the drawings, like reference numerals are used throughout the figures to reference like features and components. The figures are not necessarily drawn to scale.

FIGS. 2A-2E illustrate a method of manufacturing multi-chemistry structures according to an embodiment of the present invention;

FIGS. 6A-6D illustrate a method of manufacturing a hollow microlattice structure according to an embodiment of the present invention; and FIGS. 7A-7B are cross-sectional views of a polymer composite multi-chemistry structure according to an embodiment of the present invention.

DETAILED DESCRIPTION

Figure 1A:
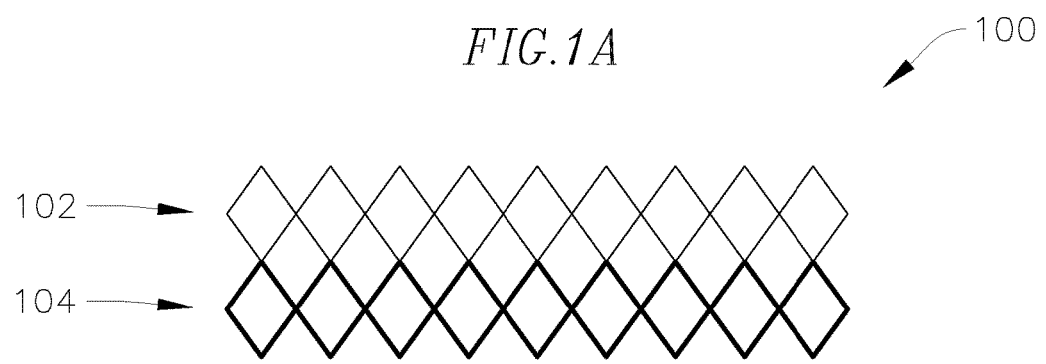
FIGS. 1A-1F are cross-sectional views of multi-chemistry structures according to various embodiments of the present invention.

Hereinafter, embodiments of the present invention will be described more fully with reference to the accompanying drawings, in which, exemplary embodiments of the present invention are shown. As those skilled in the art would realize, the described embodiments are susceptible to various modifications and alternative forms without departing from the spirit or scope of the present invention. For clarity of the description of the present invention, some elements or features not required for the complete understanding of the present invention may be omitted.

The terms used in the present specification are used to describe particular embodiments, and are not intended to limit the present invention. For example, it will be understood that, although the terms "first," "second," etc. may be used herein to describe various elements, these elements would not be limited by the strict construction of these terms. Instead, these terms are used only to distinguish one component from another. Further, an expression used in the singular encompasses the expression of the plural, unless it has a clearly different meaning in the context. In the present specification, it is to be understood that the terms such as "comprising," "including," "having," etc., are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

It will be understood that when an element or layer is referred to as being "on," "connected to," or "coupled to" another element or layer, it can be directly on, connected to, or coupled to the other element or layer, or one or more intervening elements or layers may also be present. When an element is referred to as being "directly on," "directly connected to", or "directly coupled to" another element or layer, there are no intervening elements or layers present. Additionally, when an element is referred to as being "bonded to" another element, the elements are bonded via a chemical bond, via an inter-molecular interaction, or the like. Like numbers refer to like elements throughout. As used herein, the term "and/or" includes any and all combinations of one or more of the associated listed items.

Spatially relative terms, such as "beneath," "below," "lower," "above," "upper," and the like, may be used herein for ease of description to describe one element's or feature's relationship to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "below" or "beneath" other elements or features would then be oriented "above" or "over" the other elements or features. Thus, the exemplary term "below" may encompass both an orientation of above and below. The device may be otherwise oriented (e.g., rotated 90 degrees or at other orientations), and the spatially relative descriptors used herein should be interpreted accordingly.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. Further, when describing embodiments of the present invention, the use of "may" relates to "one or more embodiments of the present invention."

One process for manufacturing microlattice structures is stereolithography. Stereolithography builds a microlattice structure in a layer-by-layer process. This process usually involves a platform that is lowered into a photo-monomer bath in discrete steps. At each step, a laser is scanned over the area of the photo-monomer that is to be polymerized for that particular layer. Once the layer is cured, the platform is lowered further, and the process is repeated until the full microlattice structure is created. Other related methods of manufacturing microlattice structures include mask projection stereolithography and interference lithography.

Other processes of manufacturing microlattice structures may utilize self-propagating polymer optical waveguides. If a monomer that is photo-sensitive is exposed to light (typically UV) under the right conditions, the initial area of polymerizations, such as a small circular area, will "trap" the light and guide it to the tip of the polymerized region, further advancing that polymerized region. This process continues, leading to the formation of a waveguide structure with approximately the same cross-sectional dimensions along its entire length.

Microlattice structures manufactured using (or utilizing) these various processes are typically limited to having a single chemistry structure made from a single photo-monomer, that is, they typically include a single shape of a unit cell made of a single polymer repeated throughout the microlattice structure, which limits functionality of the structure. For instance, the microlattice structure may be limited to having a consistent diamond shape unit cell throughout the structure.

However, multi-chemistry microlattice structures provide increased customization and functionality when compared to single-chemistry structures. A possible method of manufacturing a multi-chemistry microlattice structure is by using (or utilizing) a cut-and-glue method, where each boundary of dissimilar material is glued together. However, this method does not produce a continuous structure, and the glue adds extra weight to the structure. When stereolithography is utilized to manufacture a multi-chemistry microlattice, the process is slow and not scalable to large areas. Additionally, changing resin formulations throughout the structure adds more complexity and increases fabrication time for stereolithography.

Accordingly, the present disclosure is directed toward various embodiments of a three-dimensional structure having multiple chemistries and methods of manufacturing the same. The multi-chemistry structures according to embodiments of the present invention may be incorporated into any desired structure, such as, for example, paddings for non-uniform loading conditions, selective insulation, or scaffolds with high surface area that can be used for secondary chemical reactions. Additionally, the multi-chemistry structure may be applicable to lightweight structural components with a specific energy absorption profile (e.g., bumpers), architected structures with patches or layers of different materials, structures with regions that have different chemical affinities (e.g., hydrophobicity/hydrophilicity, surface coatings, or polymer removal), etc.

The multi-chemistry structures according to embodiments of the present invention may also be used for any suitable purposes, such as, for example, specific structural applications where variations in properties are desired (e.g., paddings and energy absorption), tuning surface chemistries for post-processing steps (e.g., selective adhesion, coating, and etching), or creating polymer-polymer composite materials.

The methods according to embodiments of the present invention allow for seamless integration of multiple chemistries and architectures in a three-dimensional structure with minimal use of any post-processing bonding steps, resulting in a relatively efficient process. The different chemistries and architectures pertain to variations along the Z-axis (e.g., the out-of-plane direction), variations within the X-Y plane (e.g., the plane that is parallel to the ground), and combinations of the two. Furthermore, embodiments of the present invention provide methods for combining one polymer structure within a second polymer structure.

Embodiments of the present invention are directed toward seamlessly integrated (e.g., by bonding) polymer microlattice materials having different chemistry components. For example, in some embodiments of the present invention, same types of chemical bonds occur at an interface between polymers having different chemistries. In other embodiments of the present invention, the polymers having different chemistries adhere to each other at their interface via intermolecular interactions or tangling. Methods of manufacturing the microlattice utilize at least two variations of resin formulations during the process. The layered chemistries of the resulting multi-chemistry microlattice structure can be used for, for example, mechanical purposes, sacrificial purposes for post-processing, or to tune the optical properties for polymer waveguide formation.

FIGS. 1A-1F are cross-sectional views of multi-chemistry structures according to various embodiments of the present invention.

Referring to FIGS. 1A-1F, multi-chemistry structures according to various embodiments of the present invention include a polymer structure having at least two different polymer chemistries. In the illustrated embodiments, the polymer structures each include a plurality of interconnected polymer struts or truss elements (e.g., a plurality of interconnected polymer optical waveguides) arranged in a unitary three-dimensional lattice structure. In the illustrated embodiments, the truss elements are arranged and oriented into layers.

Each layer includes an array of octahedral unit cells (i.e., the unitary lattice structure includes a series of octahedral unit cells), although in one or more alternate embodiments, the truss elements may be arranged and oriented into any other suitable configurations, such as, for instance, arrays of hexahedral unit cells. When taking a cross-section of an array of octahedral unit cells, the result looks like an array of diamond shaped unit cells, as illustrated in FIGS. 1A-1F. Although in the illustrated embodiments the polymer structure includes one, two, or three layers, in one or more alternate embodiments, the polymer structure may have any other suitable number of layers, such as, for instance, from one to ten layers depending on the intended application of the multi-chemistry structure. Additionally, although the illustrated embodiments show only one iteration of the illustrated multi-chemistry pattern, embodiments of the present invention may have any number of iterations of the shown multi-chemistry patterns throughout the thickness of the multi-chemistry structures, according to embodiments of the present invention.

The lattice structure is also referred to herein as "a microlattice," "a lattice," and/or "a matrix." The truss elements (e.g., the polymer optical waveguides) may have any suitable spacing, orientation, size, and/or cross-sectional shape depending upon the desired performance characteristics of the multi-chemistry structure.

In the embodiments illustrated in FIGS. 1A-1F, the layers of the lattice structure each include a plurality of upper nodes (e.g., where the struts cross or intersect with struts of an upper layer), a plurality of intermediate nodes (e.g., where the struts cross or intersect with struts of the same layer), and a plurality of lower nodes (e.g., where the struts cross or intersect with struts of a lower layer).

Referring to FIG. 1A, the multi-chemistry microlattice structure 100 is illustrated as having two layers of units cells, an upper layer 102 and a lower layer 104. The lower nodes of the upper layer 102 are coupled to (e.g., bonded to) the upper nodes of the lower layer 104. In the present embodiment, the upper layer 102 is made of a different polymer chemistry than that of the lower layer 104, and the two layers having the different chemistries are bonded together at nodes (e.g., where the lower nodes of the upper layer 102 are coupled to (e.g., bonded to) the upper nodes of the lower layer 104). The unit cells of the upper layer 102 are made from a first chemistry (e.g., from a first photo-monomer), and the unit cells of the lower layer 104 are made from a second chemistry (e.g., from a second photo-monomer).

Figure 1B:
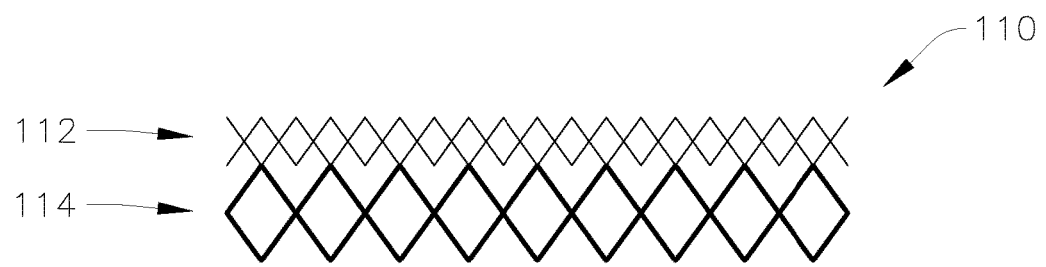

Referring to FIG. 1B, the multi-chemistry lattice structure 110 is similar to the embodiment shown in FIG. 1A. The present embodiment includes an upper layer 112 and a lower layer 114. The upper layer 112 is made from a first chemistry and the lower layer 114 is made from a second chemistry that is different from the first chemistry. A difference between the present embodiment and that of FIG. 1A is that the unit cells of the upper layer 112 are smaller than those of the lower layer 114. This may be accomplished by using (or utilizing) a photomask for creating the upper layer 112 that is different from a photomask that is used to create the lower layer 114. This method of manufacturing is described in more detail below. Because the unit cells of the upper layer 112 are smaller than those of the lower layer 114, the upper layer 112 has a higher frequency of unit cells along the upper layer 112 than does the lower layer 114 (e.g., twice the frequency since the lower layer unit cells are coupled to (e.g., bonded to) every other upper layer unit cell). However, embodiments of the present invention are not limited to the unit cell sizes shown in FIG. 1B, as alternative embodiments may have unit cells having any suitable relative size occurring at any suitable relative frequency (e.g., each upper layer unit cell may be coupled to (e.g., bonded to) every third lower layer unit cell), depending on the intended application of the multi-chemistry structure.

Figure 1C:

Referring to FIG. 1C, the multi-chemistry structure 120 is illustrated as having only one layer 122. However, other embodiments of the present invention may have any number of layers having the unit cell structure shown in FIG. 1C. In the present embodiment, the area around the upper nodes of the unit cells (e.g., caps of the unit cells) is formed from a different photo-monomer than the remainder of the unit cells. This may be accomplished by forming less than a full unit cell from a first photo-monomer by decreasing the amount of the first photo-monomer resin in a reservoir, and then manufacturing the remainder of the unit cells using (or utilizing) a different second photo-monomer resin to form the caps. In other embodiments of the present invention, any fraction of the unit cells may be manufactured from a first photo-monomer while a remainder of the unit cells is formed from a different second photo-monomer (e.g., one-half of the unit cells is made from the first photo-monomer and the other half is made from the second photo-monomer). In other embodiments, the unit cells of an upper layer above layer 122 has the same structure as the unit cells of layer 122, except that the unit cells of the upper layer are flipped, that is, instead of a cap having a different chemistry, it is the bottom of the unit cells that have the different chemistry. Accordingly, in these alternate embodiments, the portion having the second chemistry is at a region where the upper layer is coupled (e.g., bonded to) to the layer 122, forming an "X" shape of the second polymer chemistry, while the remainder of the unit cells in both the upper layer and layer 122 are formed having the different first chemistry. In other words, the second polymer chemistry is formed at regions around nodes of the multi-chemistry microlattice.

Figure 1D:

Referring to FIG. 1D, the multi-chemistry structure 130 includes caps having a second chemistry that are between full unit cells of layer 132 having a first chemistry. In other embodiments, the unit cells of an upper layer above layer 132 have the same structure as the unit cells of layer 132 except that they are flipped such that the caps having the second chemistry of both the layer 132 and the upper layer are coupled (e.g., bonded to).

Figure 1E:
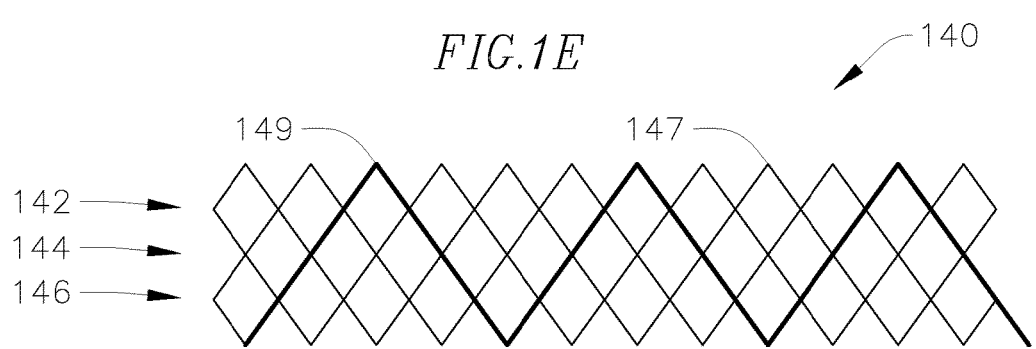

Referring to FIG. 1E, multi-chemistry structure 140 includes three layers of unit cells: an upper layer 142, an intermediate layer 144, and a lower layer 146. FIG. 1E illustrates a hierarchical structure where the second chemistry structure 149 is formed into the first chemistry structure 147, thereby encapsulating (e.g., overlapping) some trusses of the first chemistry structure 147. As shown, the second chemistry structure 149 traverses the first chemistry structure 147 from the lower layer 146 to the intermediate layer 144 to the upper layer 142 and back down the first chemistry structure 147, thereby forming an interpenetrating network of the first and second chemistry structures. To accomplish manufacturing of the second chemistry structure 149 along the first chemistry structure 147, a photomask may be changed during the process. Further details regarding the manufacturing process of an interpenetrating network multi-chemistry structure are described below. In other embodiments of the present invention, a second chemistry structure may encapsulate a first chemistry structure in any suitable way, and therefore any desired and suitable architecture of an interpenetrating network may be formed.

Figure 1F:
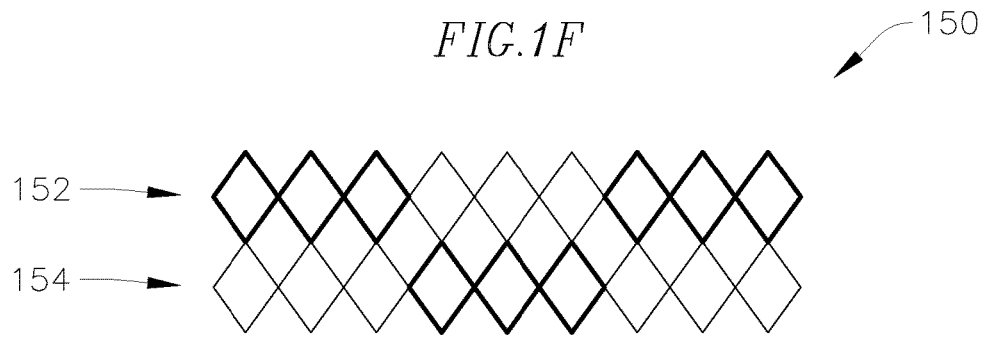

Referring to FIG. 1F, the multi chemistry structure 150 is similar to that shown in FIG. 1A, except that the upper layer 152 and the lower layer 154 each include unit cells having a first chemistry and a second chemistry. As illustrated, the upper layer 152 includes three unit cells having a first chemistry followed by three unit cells having a second chemistry. The lower layer 154 is coupled to (e.g., bonded to) the upper layer 152 and includes the opposite configuration of unit cells than does the upper layer 152, as the lower layer 154 includes three unit cells having the second chemistry followed by three unit cells having the first chemistry. FIG. 1F illustrates that multi-chemistry structures according to embodiments of the present invention may have varied chemistries not just along the Z-axis, but may have varied chemistries within the X-Y plane as well. The chemistries of the unit cells may vary along a layer in any suitable manner, and not just in the configuration depicted in FIG. 1F. For example, the unit cells may alternate in chemistry every unit cell or every two unit cells. This structure may be fabricated in a piece-wise manner. For example, in some embodiments, in the first layer, a photomask would have patterns in the relevant area (e.g., a middle section would be blank). Then, the resin may be switched and the photomask may be switched so that the middle section of the other chemistry would be formed. A similar process may be followed for subsequent layers.

Although the above embodiments of FIGS. 1A-1F illustrate a microlattice structure having two different polymer chemistries, embodiments of the present invention are not so limited. Structures according to embodiments of the present invention may include any suitable number of polymer chemistries for their intended applications (e.g., greater than two chemistries). Furthermore, any suitable combinations of the embodiments shown in FIGS. 1A-1F may be used in embodiments of the present invention, along with other suitable chemistry configurations and unit cell architectures that are not depicted in FIGS. 1A-1F, according to the scope and spirit of embodiments of the present invention.

FIGS. 2A-2E illustrate a method of manufacturing multi-chemistry structures according to an embodiment of the present invention.

Referring to FIG. 2A, a stacked process may be utilized to fabricate the layered chemistry structures shown in FIGS. 1A-1F, and other embodiments of layered multi-chemistry structures. The multi-chemistry microlattice fabricating system 200 includes a substrate 202 attached to the bottom of a translating platform configured to move in an upward or downward direction (e.g., along the z-axis) and a reservoir 204. Furthermore, at the bottom of the reservoir 204, the multi-chemistry microlattice fabricating system 200 includes a glass spacer 206 coupled to (e.g., bonded to) a photomask 208.

The reservoir 204 has a base and vertical walls or rims extending upward from a periphery of the base such that the reservoir 204 is capable of receiving a volume of liquid photo-monomer. In embodiments, the base of the reservoir 204 is translucent to those wavelengths of light that are configured to polymerize a liquid photo-monomer deposited into the reservoir during manufacturing. The photomask 208 defines a plurality of apertures that guide the polymerizing light used to create the microlattice structure, and may have any desired size, shape, and spacing, depending upon the desired characteristics of the final microlattice polymer structure.

The method includes filling at least a portion of the reservoir 204 with a volume of a first photo-monomer 210. The first photo-monomer 210 is configured to polymerize when exposed to light within a particular range of wavelengths, such as, for instance, ultraviolet light. The method further includes lowering the substrate 202 attached to the translating platform until the substrate 202 abuts against an upper surface of the volume of the first photo-monomer 210, as illustrated in FIG. 2A. In embodiments of the present invention, suitable photo-monomers are capable of cross-linking across an interface between different monomers. Furthermore, suitable photo-monomers may be immiscible monomers (e.g., water soluble monomers and nonpolar monomers). Other examples of liquid photo-monomers are described in U.S. Pat. No. 8,017,193, the entire content of which is incorporated herein by reference.

Referring to FIG. 2B, the first liquid photo-monomer 210 in the reservoir 204 is irradiated with a plurality of collimated light beams (e.g., ultraviolet light ("UV") beams) 212 from one or more light sources through the photomask 208 and the glass spacer 206. Regions of the first photo-monomer 210 that are exposed to the collimated light beams 212 cure (i.e., polymerize). The polymerized regions propagate up through the volume of the first photo-monomer 210 and form a plurality of first polymer optical waveguides 214 in the form of a microlattice that adheres to substrate 202. Suitable methods for forming polymer optical waveguides are described in U.S. Pat. Nos. 7,653,279 and 7,382,959, the entire content of both of which are incorporated herein by reference.

Referring to FIG. 2C, the substrate 202 is raised via the translating platform until the first polymer optical waveguides 214 are lifted out of a remaining volume of unpolymerized first photo-monomer 210 in the reservoir 204. The remaining volume of the first photo-monomer 210 is removed from the reservoir 204.

Figure 2D:
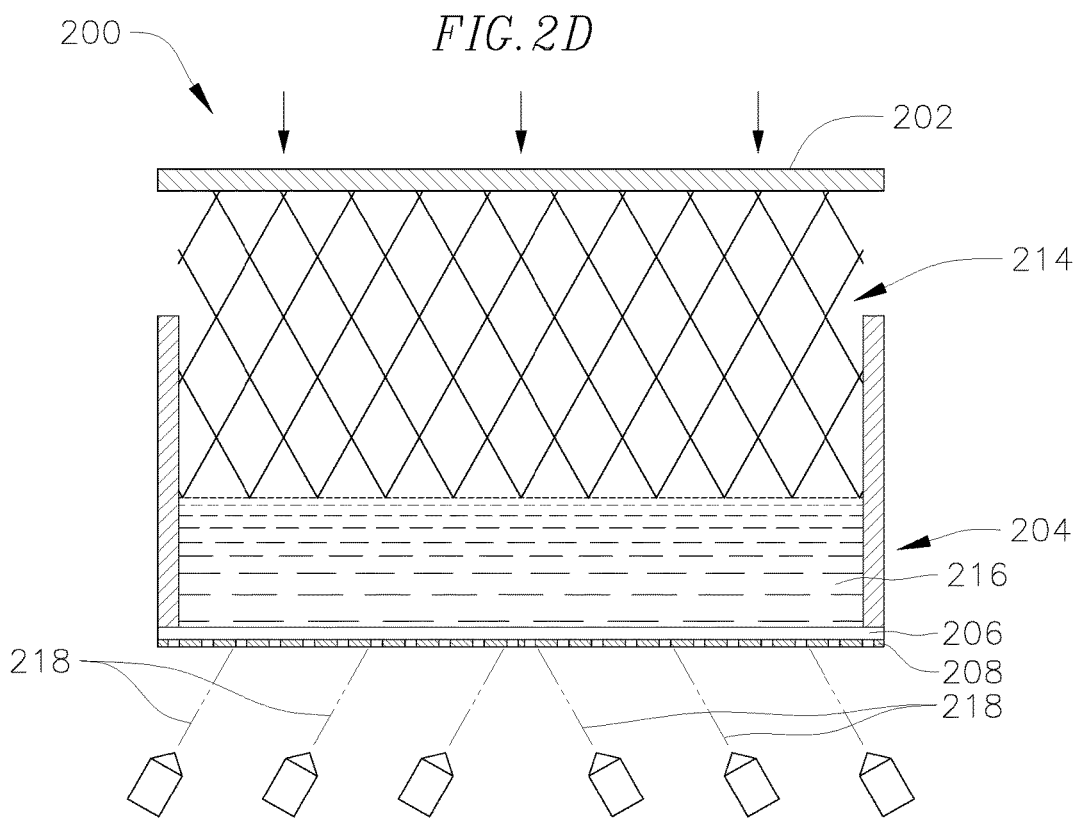
Figure 2E:
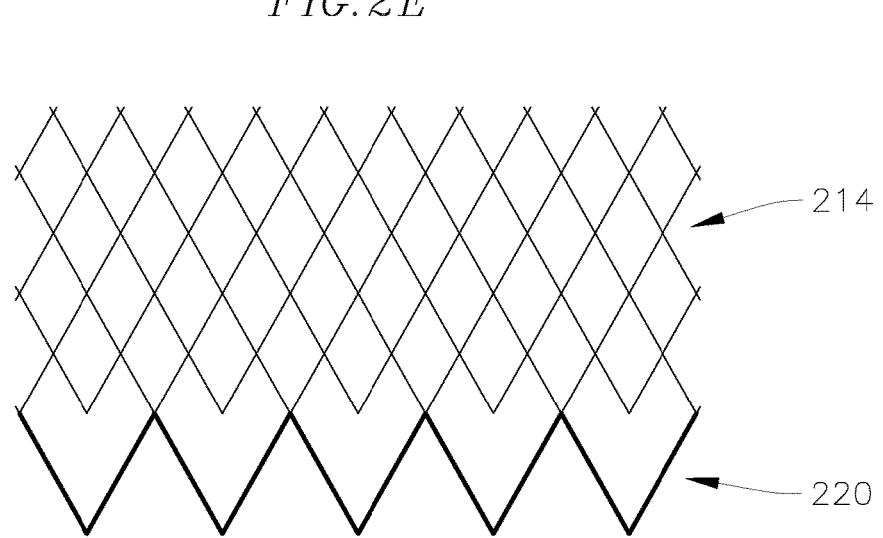

Referring to FIGS. 2D and 2E, at least a portion of the reservoir 204 is filled with a volume of a second photo-monomer 216, and the translating platform is actuated to lower the substrate 202 and the attached first polymer optical waveguides 214 until a lower end of the first polymer optical waveguides 214 contacts an upper surface of the volume of the second photo-monomer 216. In embodiments of the present invention, the first photo-monomer is different (i.e., different in chemistry) than the second photo-monomer. The volume of the second photo-monomer 216 in the reservoir 204 is irradiated with a plurality of collimated light beams (e.g., UV beams) 218 from one or more light sources to form a second portion of the polymer structure. Accordingly, regions of the second photo-monomer 216 that are exposed to the collimated light beams cure (i.e., polymerize). The polymerized regions propagate up through the volume of the second photo-monomer 216 and form a plurality of second polymer optical waveguides 220, which are attached to the first polymer optical waveguides 214.

In one embodiment, the mask used during the irradiating of the first photo-monomer may be the same as the mask used during the irradiating of the second photo-monomer. In one or more alternate embodiments, the mask used during the irradiating of the second photo-monomer may be different than the mask used during the irradiating the first photo-monomer. For instance, the shape, size, spacing, and/or arrangement of the apertures in the mask may differ depending on the desired shape, size, spacing, and/or arrangement of the polymer optical waveguides formed from the second photo-monomer, thereby changing the shape, size, spacing, and/or arrangement of the unit cells of the microlattice structure. For example, a photomask change may occur during the manufacturing of the structure illustrated in FIGS. 1B, 1D, and 1E to alter the shape of the second polymer optical waveguides from the first polymer optical waveguides. Accordingly, in one or more embodiments, the method may include replacing the photomask with another photomask having a different configuration after the irradiating of the first photo-monomer.

Additionally, in the illustrated embodiment, the collimated light beams are directed through the second photo-monomer at the same angles that the collimated light beams were directed through the first photo-monomer. In one or more alternate embodiments, the method may include repositioning and/or reorienting the light sources such that the collimated light beams are directed through the second photo-monomer at a different angle than the collimated light beams were directed through the first photo-monomer, depending on the desired configuration of the polymer structure.

The above-described tasks of actuating the moveable platform to raise the substrate and lift the polymer optical waveguides out of the unpolymerized first photo-monomer in the reservoir, removing the unpolymerized first photo-monomer from the reservoir, at least partially filling the reservoir with a second photo-monomer, and irradiating the volume of the second photo-monomer with a plurality of collimated light beams may be repeated any suitable number of times to achieve a polymer structure having a desired number of layers and a desired thickness suitable for the intended application and desired properties of the multi-chemistry structure. For example, after polymerizing the second photo-monomer, the unpolymerized second photo-monomer may be removed from the reservoir, the reservoir may be filled with the first photo-monomer, and the above process may be repeated as many times as desired depending on the intended application of the completed microlattice structure.

Additionally, other embodiments of the present invention may use a third photo-monomer that is different from the first and second photo-monomer during fabrication process. Embodiments of the present invention may use any suitable number of different photo-monomers to achieve a polymer structure suitable for the intended application and desired properties of the multi-chemistry structure.

In other embodiments of the present invention, conventional layer-by-layer methods such as stereolithography may be utilized as possible methods for fabricating multi-chemistry lattice structures.

Suitable methods of manufacturing multi-chemistry structures are described in U.S. patent application Ser. No. 14/461,841 entitled "Stacked Microlattice Materials and Fabrication Processes," filed on Aug. 18, 2014, the entire content of which is incorporated herein by reference.

Figure 3A:
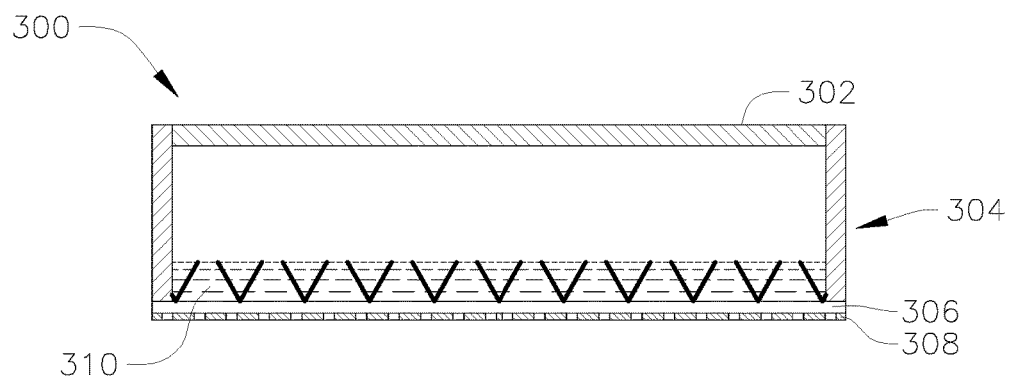
FIGS. 3A-3C illustrate a method of manufacturing multi-chemistry structures according to another embodiment of the present invention.
Figure 3B:
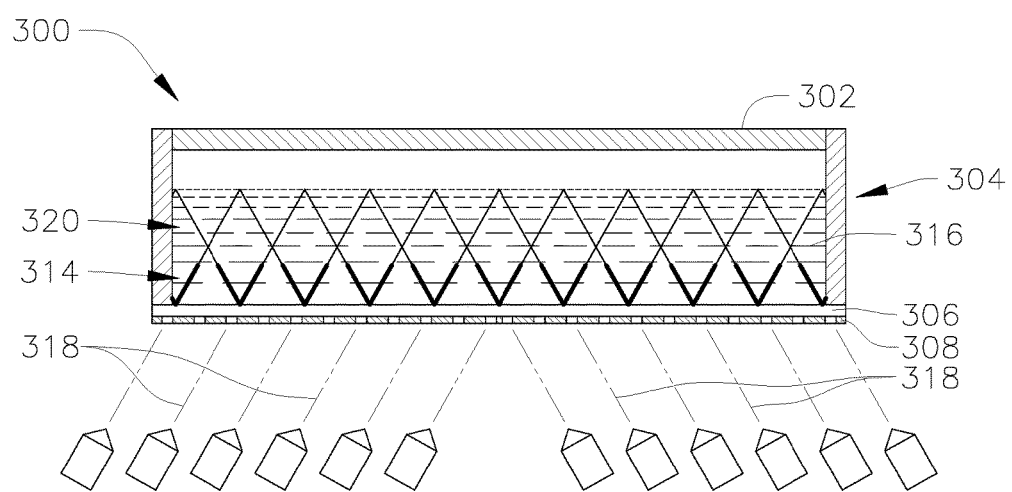
Figure 3C:
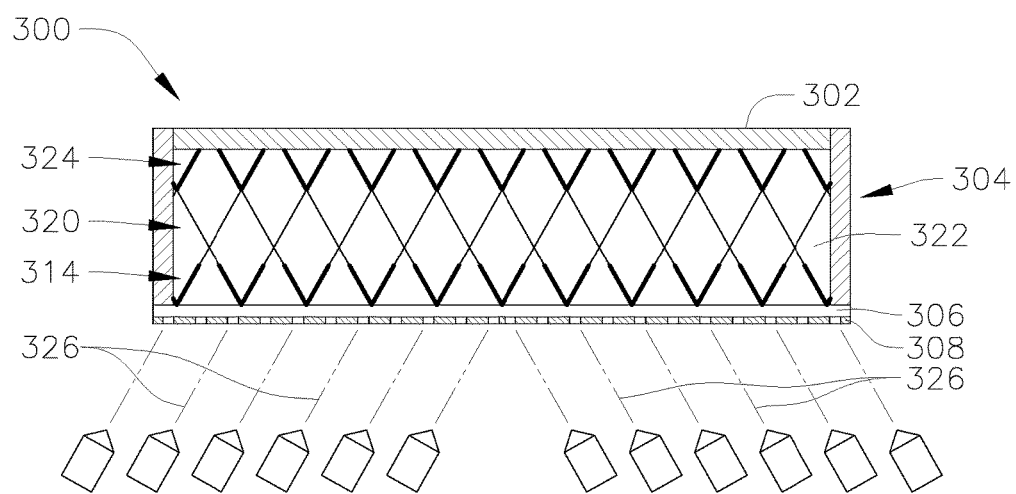

FIGS. 3A-3C illustrate a method of manufacturing multi-chemistry structures according to another embodiment of the present invention.

Referring to FIG. 3A, the method includes filling at least a portion of a reservoir 304 with a volume of a first photo-monomer 310. In the illustrated embodiment, the reservoir is defined by a mold having a glass spacer 306 and a rim extending up from a periphery of the base. The method also includes covering the glass spacer 306 of the reservoir 304 with a photomask 308 defining a plurality of apertures. The first photo-monomer 310 is filled in the reservoir to a height that may be selected depending on the desired configuration of the multi-chemistry microlattice.

The method also includes irradiating the volume of the first photo-monomer 310 by directing a plurality of collimated light beams from one or more light sources up through the apertures in the photomask 308 and through the glass spacer 306 of the mold. Regions of the first photo-monomer 310 that are exposed to the collimated light beams cure (i.e., polymerize) to form a plurality of first polymer optical waveguides 314. In the illustrated embodiment, the first polymer optical waveguides 314 are discrete segments, although in one or more alternate embodiments, the polymer optical waveguides may be polymerized into a unitary structure.

Referring to FIG. 3B, the method also includes removing the unpolymerized volume of the first photo-monomer 310 from the reservoir and filling the reservoir with a volume of a second photo-monomer 316. In the illustrated embodiment, the volume of the second photo-monomer 316 is filled to a height in the reservoir 304 such that an upper surface of the second photo-monomer 316 is above the first polymer optical waveguides 314 formed from the first photo-monomer 310 (i.e., the volume of the second photo-monomer 316 is greater than the volume of the first photo-monomer 310 such that the first polymer optical waveguides 314 formed from the first photo-monomer 310 are completely submerged in the second photo-monomer 316). The method also includes directing a plurality of collimated light beams 318 through the apertures in the mask and into the second photo-monomer 316. Additionally, in the illustrated embodiment, the collimated light beams 318 are directed through the second photo-monomer 316 at the same angles that the collimated light beams were directed through the first photo-monomer 310. Accordingly, in the illustrated embodiment, the collimated light beams 318 are directed through the first polymer optical waveguides 314 formed from the first photo-monomer 310 such that the polymer optical waveguides grow or extend up from upper ends of the first polymer optical waveguides 314 and into the second photo-monomer 316, thereby forming a layer of second polymer optical waveguides 320 coupled to (e.g., bonded to) the layer of the first polymer optical waveguides 314. Additionally, in the illustrated embodiment, the polymer optical waveguides extend or grow sufficiently into the second photo-monomer 316 such that the polymer optical waveguides are polymerized together into a unitary, lattice structure. In an alternate embodiment, the height to which the second photo-monomer 316 is filled in the reservoir may be selected such that the polymer optical waveguides remain as discrete segments.

Referring to FIG. 3C, the method may also include removing the unpolymerized volume of the second photo-monomer 316 from the reservoir 304 and filling the reservoir 304 with a third photo-monomer 322. In one embodiment, the third photo-monomer 322 may be the same as or similar to the first photo-monomer 310, although in one or more alternate embodiments, the third photo-monomer 322 may be different than the first photo-monomer 310. Additionally, in the illustrated embodiment, the third photo-monomer 322 is filled to a height in the reservoir such that an upper surface of the third photo-monomer 322 is above the second polymer optical waveguides 320. The method also includes irradiating the third photo-monomer 322 by directing a plurality of collimated light beams 326 through the apertures in the photomask 308. In the illustrated embodiment, the collimated light beams 326 are directed through the third photo-monomer 322 at the same angles that the collimated light beams were directed through the second photo-monomer 316 such that the polymer optical waveguides grow or extend up into the third photo-monomer 322.

The above-described method including filling the reservoir with a first photo-monomer, directing a plurality of collimated light beams into the first photo-monomer, filling the reservoir with a second photo-monomer, directing a plurality of collimated light beams into the second photo-monomer, filling the reservoir with a third photo-monomer, and directing a plurality of collimated light beams into the third photo-monomer may be repeated any suitable number of times depending on the desired thickness of the polymer structure.

Figure 4A:
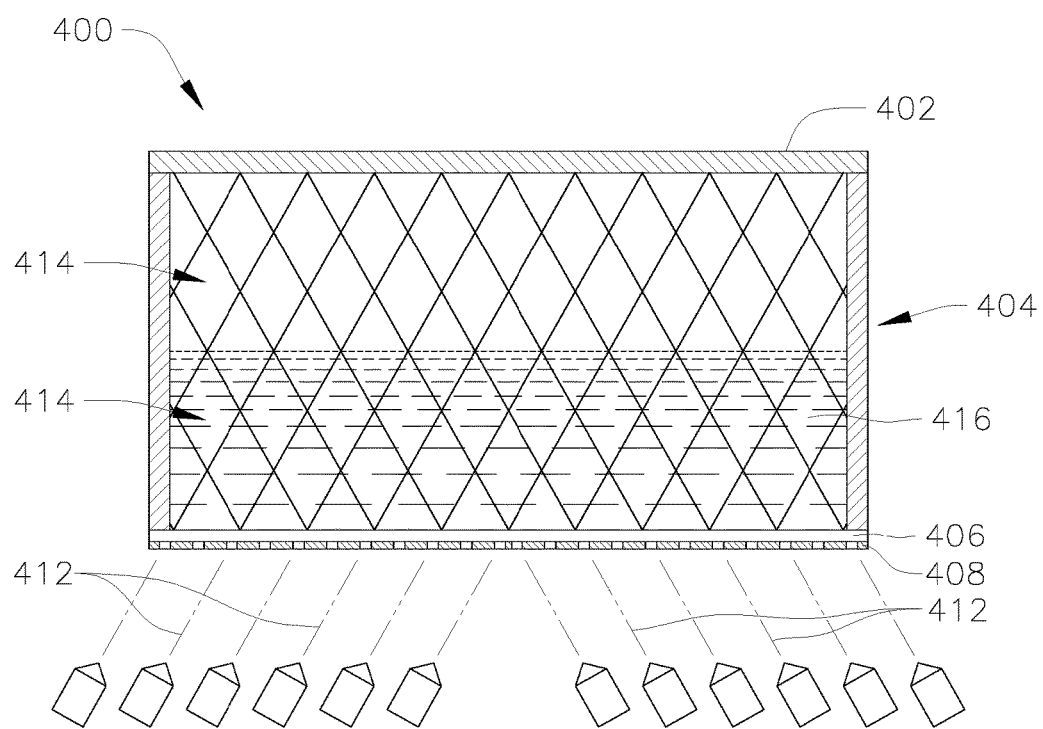
FIGS. 4A-4C illustrate a method of manufacturing multi-chemistry structures according to another embodiment of the present invention.
Figure 4B:
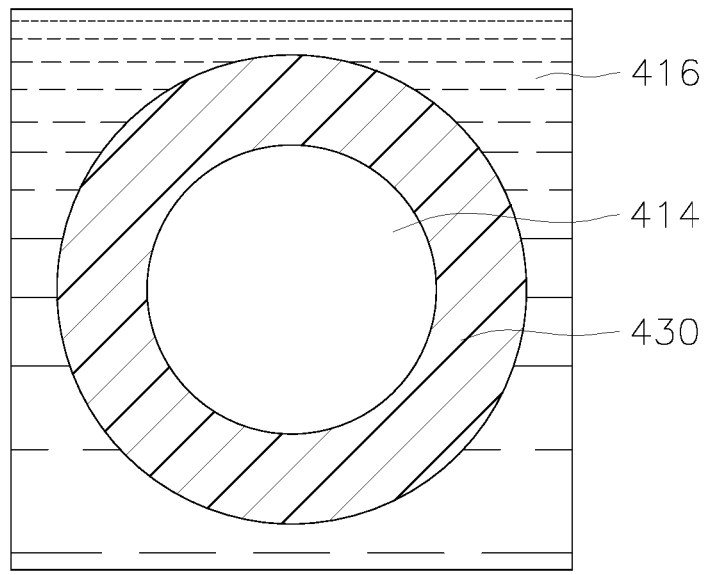
Figure 4C:
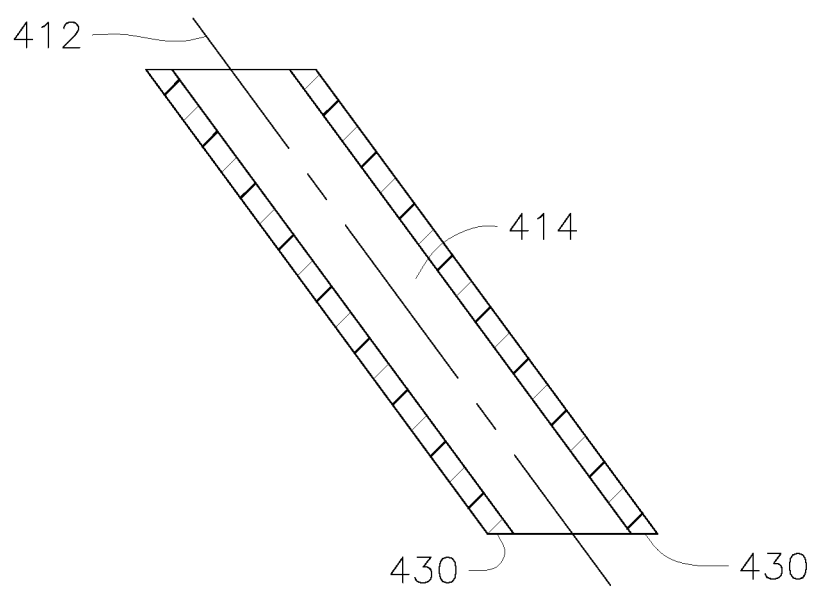

FIGS. 4A-4C illustrate a method of manufacturing multi-chemistry structures according to another embodiment of the present invention.

In the present embodiment, first polymer optical waveguides 414 may be formed in accordance with the method illustrated in FIGS. 2A-2C.

Referring to FIG. 4A, after the unpolymerized volume of a first photo-monomer from the reservoir 404 is removed, the reservoir is filled with a second photo-monomer 416. In the illustrated embodiment, the second photo-monomer 416 is filled to a height in the reservoir 404 such that an upper surface of the second photo-monomer 416 is below an upper end of the first polymer optical waveguides 414 formed from the first photo-monomer (i.e., the polymer optical waveguides 414 formed from the first photo-monomer are only partially submerged in the second photo-monomer 416). In an alternate embodiment, the second photo-monomer 416 may be filled to any other suitable height in the reservoir. For instance, in one embodiment, the second photo-monomer 416 may be filled to a height such that the upper surface of the second photo-monomer 416 is substantially flush or level with the upper end of the first polymer optical waveguides 414 formed from the first photo-monomer. In another embodiment, the second photo-monomer 416 may be filled to a height in the reservoir such that the upper surface of the second photo-monomer 416 is above the upper end of the first polymer optical waveguides 414 formed from the first photo-monomer.

Still referring to FIG. 4A, the method also includes irradiating the second photo-monomer 416 by directing a plurality of collimated light beams 412 through the apertures in the mask. Additionally, in the illustrated embodiment, the collimated light beams 412 are directed through the second photo-monomer 412 at the same angles that the collimated light beams were directed through the first photo-monomer. Accordingly, in the illustrated embodiment, the collimated light beams 416 are directed through the first polymer optical waveguides 414 formed from the first photo-monomer.

Referring to FIGS. 4B and 4C, radial effluence of the collimated light beams directed through the first polymer optical waveguides 414 causes the first polymer optical waveguides 414 submerged in the second photo-monomer 416 to grow radially outward into the second photo-monomer 416. Accordingly, thin-walled polymer shells 430 formed from the second photo-monomer 416 will form around the portions of the first polymer optical waveguides 414 submerged in the second photo-monomer 416 (i.e., the first polymer optical waveguides 414 formed from the first photo-monomer will define solid cores surrounded by the thin-walled polymer shells 430 formed from the second photo-monomer 416). The portions of the first polymer optical waveguides 414 not submerged in the second photo-monomer 416 will remain exposed (i.e., the thin-walled polymer shells formed from the second photo-monomer 416 will not form around the portions of the first polymer optical waveguides 414 that were not submerged in the second photo-monomer 416). Thicknesses of the thin-walled shells 430 may be controlled by changing the exposure duration of the collimated light beams 412. Accordingly, in one embodiment, the method includes directing the collimated light beams 412 through the polymer optical waveguides for a sufficient duration to achieve the desired thickness of the thin-walled shells 430 formed from the second photo-monomer 416. In embodiments of the present invention, this method may be utilized to manufacture a multi-chemistry structure having an interpenetrating network, such as, for example, the structure shown in FIG. 1E.

Suitable methods for forming a multi-chemistry polymer microlattice structure are also described in U.S. patent application Ser. No. 14/462,306 entitled "Structures Having Selectively Metallized Regions and Methods of Manufacturing the Same," filed on Aug. 18, 2014, the entire content of which is incorporated herein by reference.

According to embodiments of the present invention, suitable chemistries and their architectural configurations within the microlattice structure may be selected or controlled based on desired mechanical attributes of the multi-chemistry structure, which may be dependent on the intended use of the multi-chemistry structure.

The specific chemistries chosen for microlattice fabrication are tuned for the desired properties of the final structure, with minimum or no post-processing after the multi-chemistry structure is fabricated. This process allows greater tailorability of physical properties by changing spot regions of the chemistry and/or architecture. As such, variations in resin formulation may be tuned toward a specific elongation percentage, modulus, tensile strength, etc. by combining different photo-monomers. For example, a dual-layered structure for a padding application may be one where the top layer has a slow, viscoelastic response, and the bottom layer has a stiffer, elastic response. As shown by the embodiment illustrated in FIG. 1A, the upper layer 102 may be the slow, viscoelastic polymer, while the lower layer 104 may be the stiffer, elastic polymer.

Additionally, a multi-resin chemistry structure such as, for example, the embodiment shown in FIG. 1C may be used to increase or improve the mechanical properties of a high-performance structural lattice. Given that the in-plane (e.g., the X-Y plane) load bearing area of the material varies as a function of height (e.g., the Z-axis) a stress concentration exists where the amount of material is at its least (e.g., at centers of nodes at points where an upper layer and a lower layer are bonded). Under a pure shear loading case, the structure may fail at these vulnerable points. Embodiments of the present invention may thus be used to increase the strength of the structure through, for example, the use of a high modulus, more brittle polymer (e.g., highly cross-linked systems) at the vulnerable nodes and a low-modulus, more ductile polymer (e.g., lower crosslink density systems of monomers with long chain backbone structures) for the individual waveguides or struts.

This configuration is illustrated, for example, by the embodiment shown in FIG. 1C. The unit cells of an upper layer above layer 122 may have the same structure as the unit cells of layer 122 except that they are flipped, that is, instead of a cap (i.e., an upper portion of the unit cells) having a different chemistry it is the bottom of the unit cells of the upper layer that have the different chemistry. Accordingly, the portion having the second chemistry is at a region where the upper layer is bonded to the layer 122 (e.g., at nodes of the microlattice structure), forming an "X" shape, while the remainder of the unit cells in both the upper layer and layer 122 are formed having the different first chemistry. In this embodiment, the portion having the second chemistry (e.g., the portions at the nodes) may include the high-modulus, more brittle polymer, while the remainder of the unit cells having the first chemistry may include the low-modulus, more ductile polymer.

Furthermore, under a compression load case, different resin chemistries at the nodes may be used to change the effective boundary conditions on the individual waveguides. Since buckling of the waveguides is highly sensitive to the effective boundary condition (e.g., free, pinned, fixed, etc.), tailoring the stiffness of the nodal connection point may be used to obtain a higher strength lattice or a lattice with enhanced energy absorption.

The chemistry formulations of microlattice structures according to embodiments of the present invention may also be selected based on post-processing purposes. For example, photo-monomer resins with selective surface chemistries tailored for coatings, polymer removal, multi-tiered surface textures, etc. may be selected. Affinity for these processes may be tuned by changing properties such as hydrophobicity/hydrophilicity, surface energy, and surface texture. The hydrophobicity/hydrophilicity may be controlled by changing a backbone structure of the photo-monomers (e.g., using a long chain polyethylene glycol (PEG) chain). Surface texture or porosity may be created by using an emulsion of immiscible photo-monomers, or adding nanoparticles/other fillers. After curing the microlattice structure, the nanoparticles or micro-regions of a different monomer may be selectively dissolved away.

The different photo-monomer resins may also be tuned so that one system has a greater rate of polymer degradation in an etchant. One way to control this is through the number of available functional groups (e.g., reactive groups) on the surface of the multi-chemistry microlattice (e.g., functional groups at the monomers that can react with another monomer to create a cross-linked polymer network). Examples of suitable functional groups include acrylates, amines, thiols, and epoxides. Then, by choosing an etchant that attacks the functional group (e.g., an etchant that is either a basic or acidic solution), the cured photo-monomer resin with more functional groups on the surface (e.g., the portion of the microlattice having the first chemistry) will be etched faster than the cured photo-monomer resin with less functional groups on the surface (e.g., the portion of the microlattice having the second chemistry). The difference in the etch rate allows for control of surface roughness and for selective removal of polymer. In the case of increased surface roughness, the increased surface area may be exploited to selectively embed particles on the surface of microlattice layers that have been etched (e.g., layers that have been etched significantly more). The ability to selectively remove polymer from the structure allows for additional control of the architecture. By selectively etching portions of the microlattice structure, weaker segments (e.g., nodes of the microlattice) may be introduced to allow engineering control over mechanical failure.

Figure 5A:
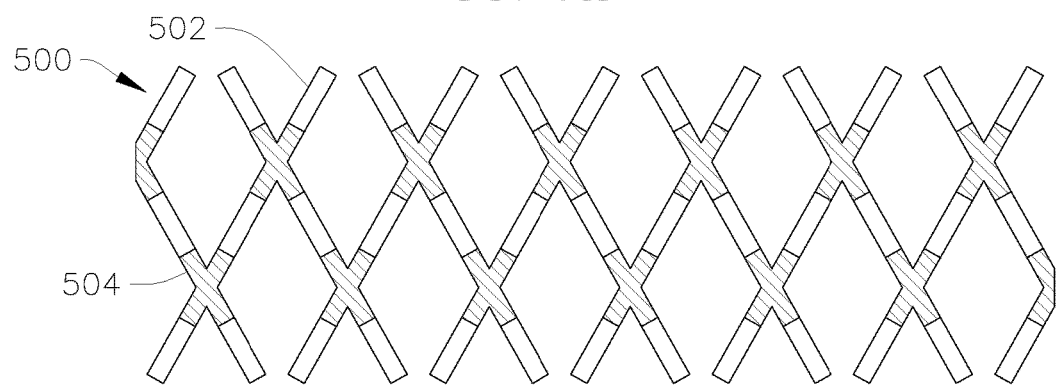
FIGS. 5A-5C illustrate a method of manufacturing an etched multi-chemistry structure according to an embodiment of the present invention.
Figure 5B:
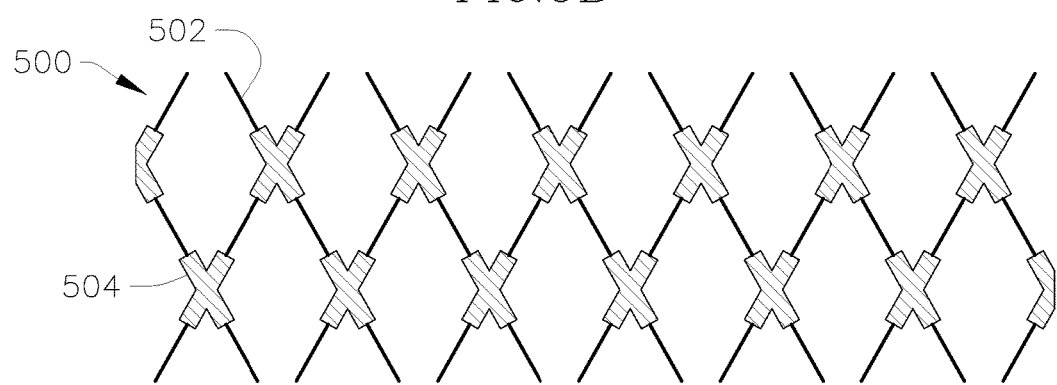
Figure 5C:
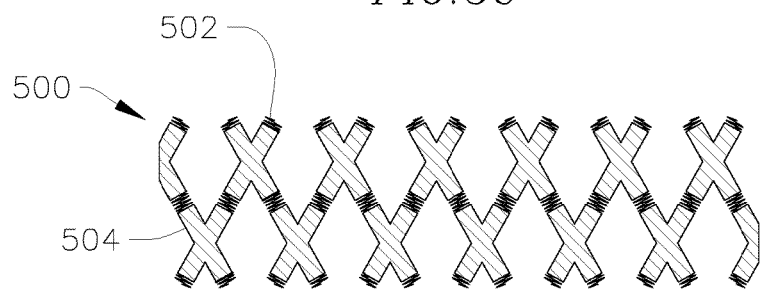

FIGS. 5A-5C illustrate a method of manufacturing an etched multi-chemistry structure according to an embodiment of the present invention.

The ability to selectively remove polymer in post-processing allows for an additional method of control for the mechanical properties. Referring to FIG. 5A, microlattice 500 includes struts 502 that intersect and meet at nodes 504. The first and second photo-monomers may be selected such that the portions of the polymer optical waveguides formed from the first photo-monomer are configured to etch at a faster rate than the polymer optical waveguides formed from the second photo-monomer. This disparity in etching rates permits the polymer optical waveguides formed from the second photo-monomer to be suitably/properly etched and the polymer optical waveguides formed from the first photo-monomer to be over-etched during the task of etching the polymer structure. According to the present embodiment, the struts 502 may be formed of a polymer that is susceptible to etching, and the nodes 504 may be formed of a polymer that is configured to resist etching. The illustrated multi-chemistry microlattice structure of FIG. 5A may be manufactured using any of the above-disclosed methods for manufacturing a multi-chemistry structure.

Referring to FIG. 5B, the microlattice 500 may be held in an etching solution to reduce the diameter of the struts, thereby effectively reducing the compressive load they can bear. As noted above, because the struts 502 may be formed of a polymer that is susceptible to etching (e.g., acrylates or polymers that contain ester linkages), and the nodes 504 may be formed of a polymer that is configured to resist etching (e.g., cycloaliphatic epoxy or polymers that do not contain ester linkages), when the microlattice 500 is placed in the etching solution, the struts 502 are etched at a faster rate than the nodes 504 are etched (e.g., the nodes 504 may not be etched at all while the struts 502 are etched). As a result, the microlattice 500 includes struts 502 that have a relatively smaller diameter than that of the nodes 504. Etching the polymer structure includes immersing the polymer structure in an etchant solution, such as a heated acidic oxidative solution (e.g., a mixture of chromic and sulfuric acid in deionized water (DIW)) or a basic oxidative chemical solution (e.g., potassium permanganate and sodium hydroxide in DIW). In one embodiment, the task of etching the polymer structure includes immersing the polymer structure in an etchant solution of 50% wt NaOH, 6% $KMnO_4$, and 44% DIW at a temperature of approximately 45° C. and for a duration of approximately 2 minutes. The etching of the polymer structure is configured to roughen the surfaces of the polymer optical waveguides and thereby increase the surface area of the polymer optical waveguides.

Referring to FIG. 5C, the etched microlattice 500 is subjected to compressive stress. As illustrated, the microlattice 500 is compressed substantially at the struts 502, while the nodes 504 exhibit relatively minor compression. Accordingly, the illustrated embodiment of the etched microlattice 500 allows for a more stable microlattice that is capable of withstanding increased amounts of load. The chemistry configuration of microlattice structures according to embodiments of the present invention are not limited to the illustrated embodiment of FIGS. 5A-5C, as any suitable configuration or architecture for etching may be used depending on an intended purpose of the final microlattice structure. For example, some struts may be etched more than other struts, while the nodes remain relatively un-etched.

FIGS. 6A-6D illustrate a method of manufacturing a hollow microlattice structure according to an embodiment of the present invention.

In embodiments of the present invention, the microlattice structure may be used as a template for coating processes and to create hollow microlattice structures. Selective etching may therefore be used to reduce the effective diameter of some of the flow paths. This customization allows for additional control of flow and pressure drop within the microlattice. To achieve this, a multi-chemistry microlattice structure is formed and etched as described above in connection with FIGS. 5A-5C. Embodiments of the present invention may have any suitable number of struts connected at any suitable number of nodes as desired for the intended purpose of the microlattice structure, and for purposes of illustration only is only one node illustrated in FIGS. 6A-6D.

Figure 6A:
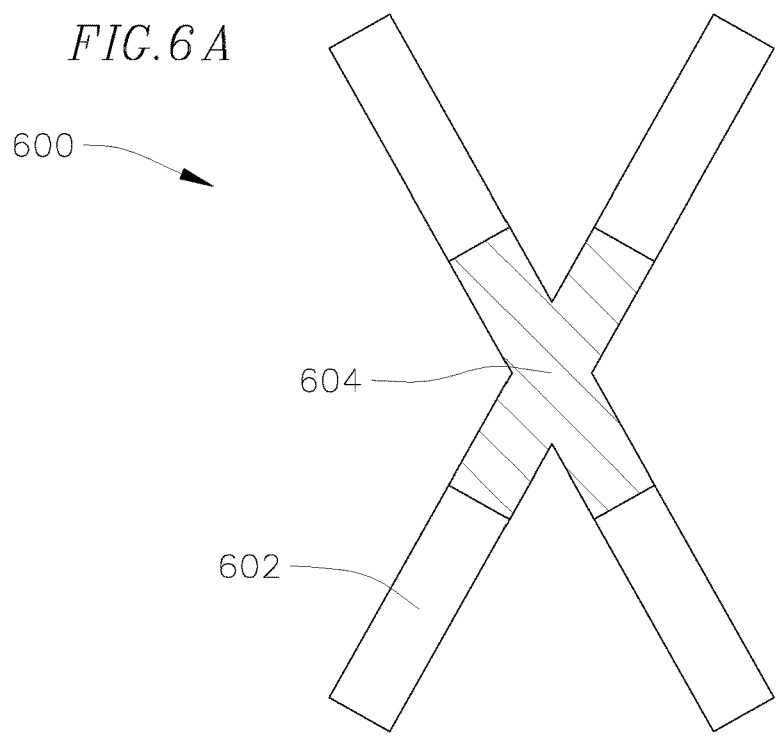
Figure 6B:
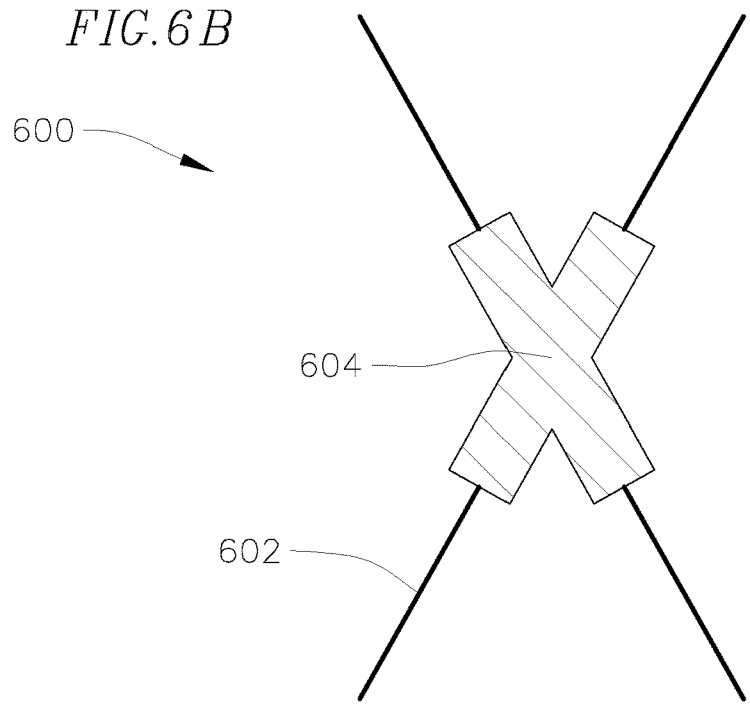

Referring to FIGS. 6A-6B, the microlattice structure 600 includes struts 602 that may be formed of a polymer that is susceptible to etching, and at least one node 604 that may be formed of a polymer that is configured to resist etching. The microlattice structure 600 is etched as described above such that the struts 602 have a diameter that is less than that of the node 604.

Figure 6D:
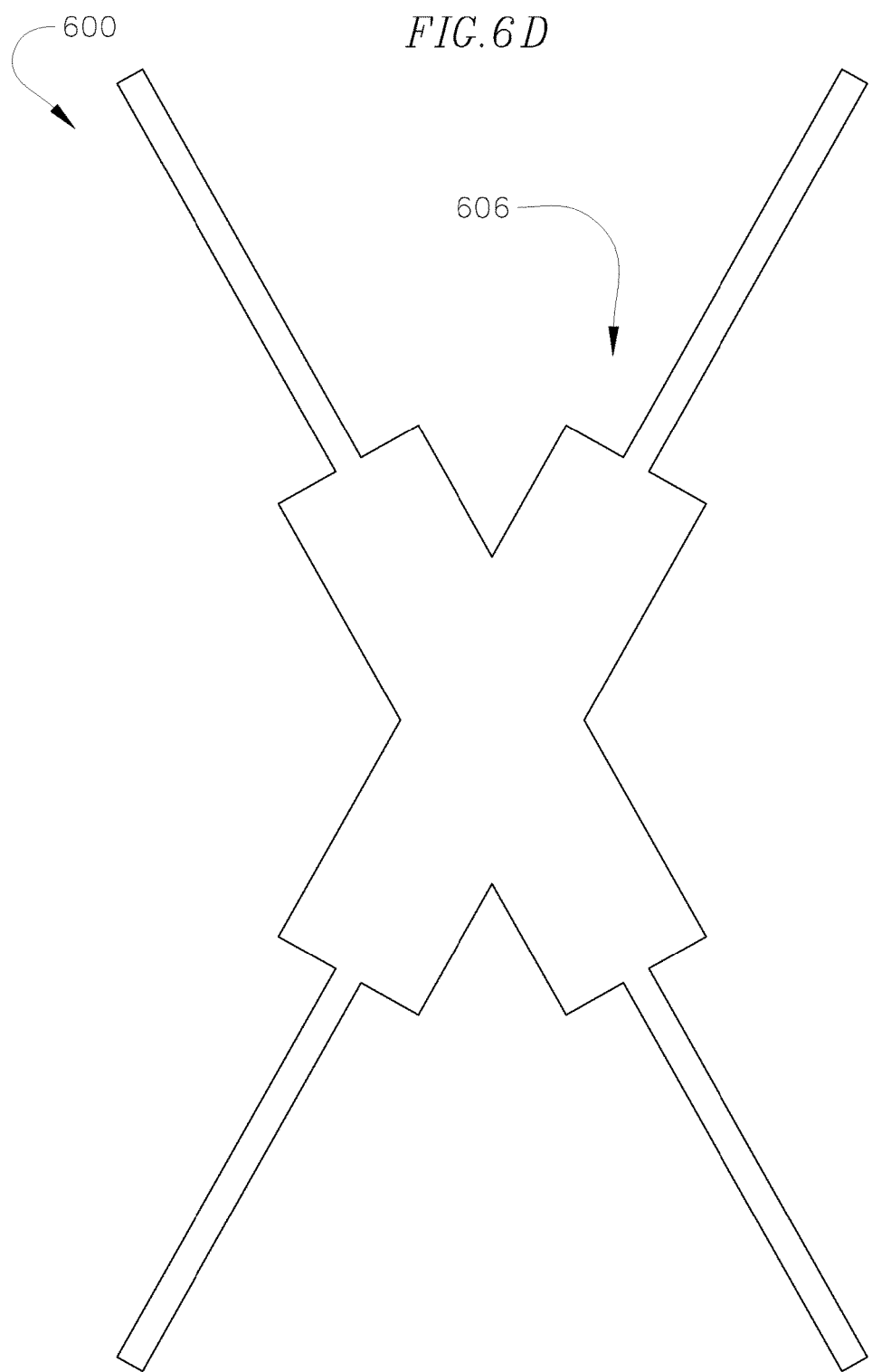

Referring to FIGS. 6C and 6D, the etched microlattice structure 600 is coated in a uniform coating 606 (e.g., a metallic or polymer coating). The uniform coating 606 may be applied to the polymer structure by any suitable process, such as, for instance, chemical vapor deposition, sputtering, slurry coating, electro-plating, or electroless plating. Then, the microlattice structure 600 is subjected to different conditions, such as more severe etching, chemical oxidation, oxidation through burn out, etc., such that the remains of both polymers (e.g., a first polymer chemistry and a second polymer chemistry) are removed, leaving behind the uniform coating 606 as a hollow shell, as shown in FIG. 6D. The hollow shell includes the outlines of the struts 602 and the node 604, and as such, the hollow shell has a thinner structure along the struts 602 than along the node 604, in accordance with the shape of the etched microlattice structure 600. The hollow structure may have a flow area at the node that matches the total flow area of the struts combined, thereby effectively reducing an internal pressure drop of the microlattice structure 600.

FIGS. 7A-7B are cross-sectional views of a polymer composite multi-chemistry structure according to an embodiment of the present invention.

In another application of multi-chemistry structures according to embodiments of the present invention, the resin formulations may be tuned to create immiscible solutions (e.g., water soluble monomers and nonpolar monomers) that are initiated under different optical profiles (e.g., initiated in response to different wavelengths of light), so the polymerization reaction becomes multi-step and polymer-polymer composites are possible.

In general, photo-monomer resins for microlattice fabrication are formulated for a low absorption, long optical waveguide propagation, whereas stereolithography or coating resins are formulated for the opposite: high absorption for short curing distances. The wavelength range for free radical activation may be tuned as well, using different photo-initiators, so two different resin systems may be activated at two different, non-overlapping wavelength ranges.

In one embodiment, the first photo-monomer resin may be formulated to have low absorption, long waveguide propagation, with a photo-initiator that is activated at longer wavelengths, while the second photo-monomer resin has high absorption, short waveguide propagation, and a photo-initiator active at shorter wavelengths. Suitable photo-monomer resins are described in U.S. patent application Ser. No. 14/255,623 entitled "Method for Curing Structures Using a Dual Photoinitiator System and a Structure Made Using the Same," filed on Apr. 17, 2014, the entire content of which is incorporated herein by reference. These two resins may also be immiscible so that when mixed together, two distinct phases exist in the solution (e.g., one phase of a first resin and a second phase of a second resin). These phases may be in the form of, for example, micro-dispersed spheres of a second polymer (e.g., a second phase) within a matrix or lattice of a first polymer (e.g., a first phase), or in the form of an interpenetrating network. As an example, micro-dispersed spheres exist in a system where the first and second polymers are immiscible, and the quantity of the second polymer is much less than the quantity of the first polymer, and when the two liquid phases are mixed together vigorously, the second polymer forms micro-dispersed spheres within the first polymer. However, embodiments of the present invention are not so limited, as any suitable number of phases of immiscible resins may be utilized to achieve a desired microlattice structure.

Referring to FIGS. 7A and 7B, an apparatus like that disclosed in connection with FIGS. 2-4 may be utilized to manufacture the microlattice structure according to the present embodiment. A reservoir may be filled with a volume of a first photo-monomer and an immiscible second photo-monomer may be selectively inserted in the reservoir with the first photo-monomer (e.g., the second photo-monomer may be in the form of a plurality of microspheres within the volume of the first photo-monomer). Then, according to methods described above, a plurality of collimated light beams may be irradiated into the reservoir such that the first photo-monomer polymerizes into a microlattice structure. Additionally, because of the immiscible second photo-monomer inserted into the first photo-monomer, the polymerized portions of the first photo-monomer will trap or encapsulate the immiscible, unpolymerized second photo-monomer within the polymerized microlattice structure when the microlattice structure is removed from the reservoir.

Referring to FIGS. 7A and 7B, the microlattice structure (i.e., microlattice) 700 illustrates an embodiment of a polymerized microlattice and an immiscible second photo-monomer resin trapped therein. The microlattice structure (i.e., microlattice) 700 includes first polymer 702 and unpolymerized photo-monomer in the form of microspheres 704 made of the immiscible second photo-monomer resin. FIG. 7B is an enhanced view of a portion of the microlattice structure 700.

The longer wavelength UV light may be illuminated to polymerize the first resin system into a microlattice structure using any of the above-described methods. This process solidifies a first polymer matrix, thereby trapping liquid microspheres of the second resin. After pulling out the microlattice structure from the reservoir bath, the microspheres of the second resin are then polymerized using a blanket shorter wavelength light source, creating a polymer composite (e.g., second polymer microspheres within a first polymer lattice structure). The medium that the microspheres are suspended in (e.g., the first polymer lattice matrix) may be inert at the wavelengths that initiate polymerization of the microspheres themselves. This two-step exposure process may also be used to cure or polymerize an interpenetrating network of two immiscible resins.

These polymer composite structures may be used for various purposes ranging from structural benefits to selective reaction sites. For example, the polymer microspheres may be tuned to have a higher modulus than the polymer of the microlattice trusses, or if the microspheres are small enough, their presence may increase toughness by decreasing instances of crack propagations. The multi-scale structure also allows for similar applications as discussed above regarding sacrificial purposes. These microspheres may be etched away without damaging the polymer of the microlattice trusses to create a structure with high surface area, or these microspheres may be the site for secondary chemical reactions.

While the present invention has been described in connection with certain example embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. A multi-chemistry structure comprising:
   a plurality of interconnected polymer struts arranged in an integrated lattice comprising a plurality of unit cells;
   a first layer of the lattice being formed of a first photopolymerized polymer; and
   a second layer of the lattice being formed of a second photopolymerized polymer different from the first photopolymerized polymer,
   wherein:
      the first layer is substantially continuous across the lattice and comprises 50% or more of each unit cell;
      the second layer comprises a remainder of each unit cell;
      the first layer is free of the second photopolymerized polymer,
      the second layer is free of the first photopolymerized polymer, and
      the first and second layers together define the boundary of a simple polygonal or polyhedral unit cell.

2. A multi-chemistry structure comprising:
   a plurality of interconnected polymer struts arranged in an integrated lattice;
   a first region of the lattice comprising an array of first unit cells, the first region being formed of a first photopolymerized polymer; and
   a second region of the lattice comprising an array of caps interpolated between the first unit cells of the first region, the array of caps forming an array of second unit cells, each of the second unit cells having a smaller area or volume than each of the first unit cells, and the second region being formed of a second photopolymerized polymer different from the first photopolymerized polymer;
   wherein the first photopolymerized polymer is chemically bonded to the second photopolymerized polymer at an interface between the first and second regions,
   wherein the first region is free of the second photopolymerized polymer, and
   wherein the second region is free of the first photopolymerized polymer.

3. A multi-chemistry structure comprising:
a plurality of interconnected polymer struts arranged in a first integrated lattice comprising an array of unit cells comprising two or more rows and two or more columns, the first integrated lattice being formed of a first photopolymerized polymer; and
a second photopolymerized polymer different from the first photopolymerized polymer, the second photopolymerized polymer encapsulating some of the polymer struts at regular intervals such that the polymer struts comprise encapsulated polymer struts that each continuously span at least two contiguous rows of the two or more rows and at least two contiguous columns of the two or more columns of the array of unit cells to form a continuous second integrated lattice.

4. A multi-chemistry structure comprising:
a plurality of interconnected polymer struts arranged in an integrated lattice comprising a plurality of unit cells;
at least one region of the lattice being formed of a first photopolymerized polymer; and
at least one region of the lattice being formed of a second photopolymerized polymer different from the first photopolymerized polymer,
wherein:
  the plurality of unit cells are bonded to respective second unit cells at a plurality of respective nodes;
  regions surrounding the respective nodes are formed of the first photopolymerized polymer and are free of the second photopolymerized polymer;
  non-nodal remainder regions of the unit cells are formed of the second photopolymerized polymer and are free of the first photopolymerized polymer; and
  the second photopolymerized polymer is more susceptible to etching than the first photopolymerized polymer.

5. The multi-chemistry structure of claim 4, wherein the lattice is coated with a substantially uniform coating.

6. The multi-chemistry structure of claim 5, wherein the substantially uniform coating comprises a third photopolymerized polymer different from the first and second photopolymerized polymers.

7. The multi-chemistry structure of claim 5, wherein the substantially uniform coating comprises a metallic coating.

* * * * *